United States Patent
Lindberg

(10) Patent No.: US 8,995,491 B2
(45) Date of Patent: Mar. 31, 2015

(54) EDGE-EMITTING SEMICONDUCTOR LASER

(75) Inventor: Hans Lindberg, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/118,819

(22) PCT Filed: Jun. 8, 2012

(86) PCT No.: PCT/EP2012/060910
§ 371 (c)(1),
(2), (4) Date: Jan. 23, 2014

(87) PCT Pub. No.: WO2012/168437
PCT Pub. Date: Dec. 13, 2012

(65) Prior Publication Data
US 2014/0133505 A1    May 15, 2014

(30) Foreign Application Priority Data

Jun. 10, 2011    (DE) .......................... 10 2011 103 952

(51) Int. Cl.
*H01S 5/00* (2006.01)
*H01S 5/10* (2006.01)
(Continued)

(52) U.S. Cl.
CPC ............. *H01S 5/1003* (2013.01); *H01S 5/0425* (2013.01); *H01S 5/1032* (2013.01);
(Continued)

(58) Field of Classification Search
CPC .............................. H01S 5/2045; H01S 5/5081
USPC .................................. 372/43.01, 44.01, 45.01
See application file for complete search history.

(56) References Cited

U.S. PATENT DOCUMENTS 5,511,084 A    4/1996 Amann
7,646,797 B1 *  1/2010 Hoffman .................... 372/46.01
(Continued)

FOREIGN PATENT DOCUMENTS

DE    3937542 A1    5/1991
DE    20108607 U1    8/2001
(Continued)

OTHER PUBLICATIONS

Amann, M.-C., et al., "Widely Tunable Distributed Forward Coupled (DFC) Laser," Electronics Letters, vol. 29, No. 9, Apr. 29, 1993, pp. 793-794.

*Primary Examiner* — Colleen A Matthews
*Assistant Examiner* — Vu A Vu
(74) *Attorney, Agent, or Firm* — Slater & Matsil, L.L.P.

(57) ABSTRACT

An edge-emitting semiconductor laser includes a first waveguide layer, into which an active layer that generates laser radiation is embedded. The laser also includes a second waveguide layer, into which no active layer is embedded. The laser radiation generated in the active layer forms a standing wave, which has respective intensity maxima in the first waveguide layer and corresponding intensity minima in the second waveguide layer and respective intensity minima in the first waveguide layer and corresponding intensity maxima in the second waveguide layer at periodic intervals in a beam direction of the semiconductor laser. An at least regionally periodic contact structure is arranged at a surface of the edge-emitting semiconductor laser. A period length of the contact structure is equal to a period length of the standing wave, such that the semiconductor laser has an emission wavelength that is set by the period length of the contact structure.

14 Claims, 7 Drawing Sheets

(51) Int. Cl.
*H01S 5/042* (2006.01)
*H01S 5/40* (2006.01)
*H01S 5/12* (2006.01)
*H01S 5/026* (2006.01)
*H01S 5/065* (2006.01)

(52) U.S. Cl.
CPC ............ *H01S5/4031* (2013.01); *H01S 5/1228* (2013.01); *H01S 5/4087* (2013.01); *H01S 5/026* (2013.01); *H01S 5/0654* (2013.01); *H01S 5/1203* (2013.01); *H01S 5/1246* (2013.01)
USPC ...................................................... 372/44.01

(56) References Cited

U.S. PATENT DOCUMENTS 7,813,399 B2 * 10/2010 Schmid ...................... 372/45.01
2011/0102804 A1 * 5/2011 Lipson et al. .................. 356/480
2011/0170569 A1 * 7/2011 Tyagi et al. .............. 372/45.013

FOREIGN PATENT DOCUMENTS

| DE | 102006046297 A1 | 4/2008 |
| DE | 102007058950 A1 | 4/2009 |
| JP | 61-251183 A | 11/1986 |

* cited by examiner

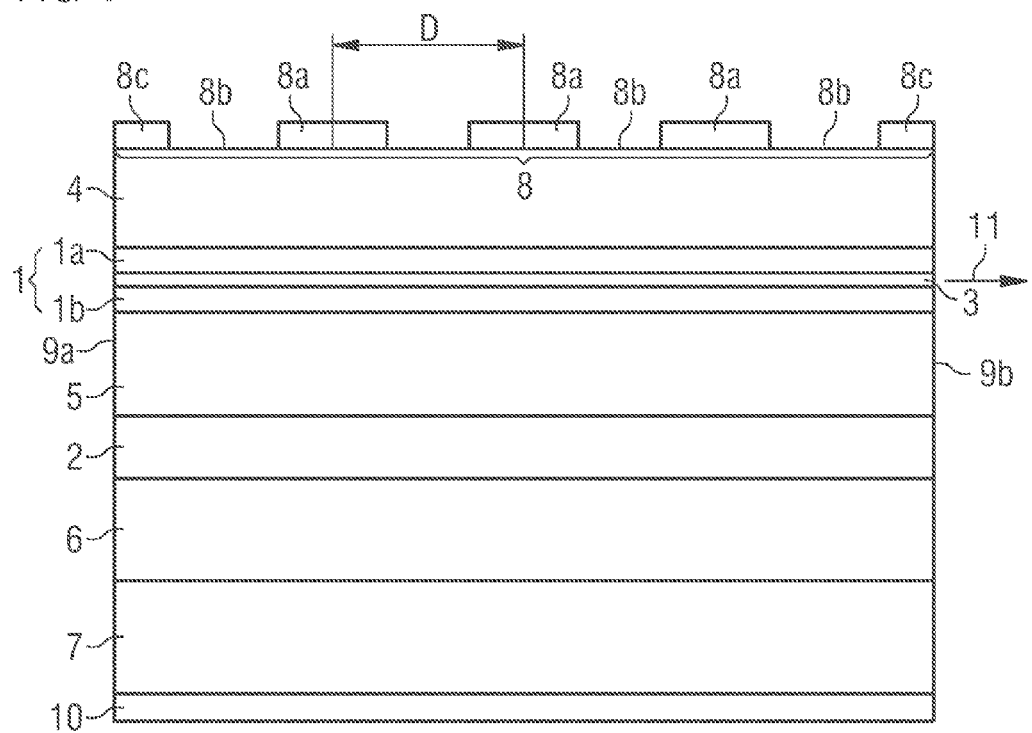
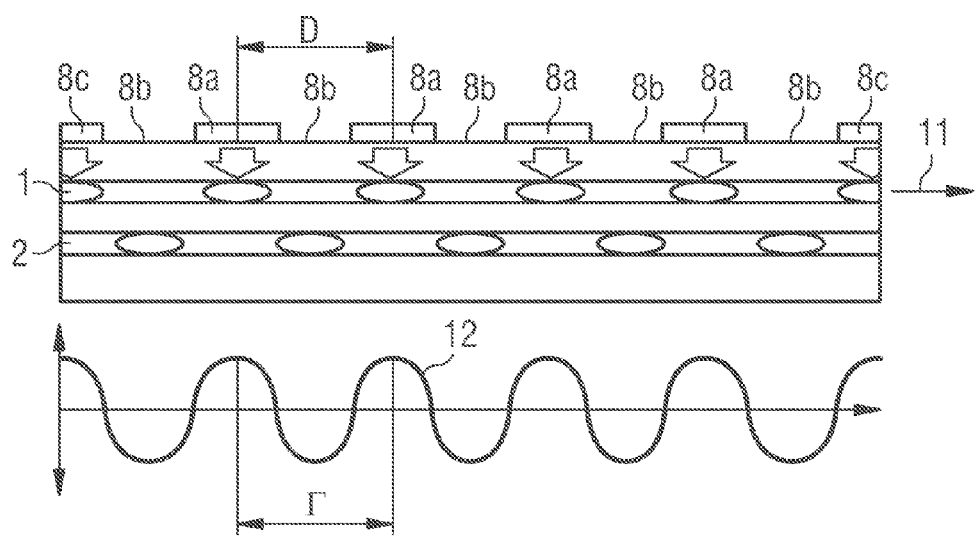

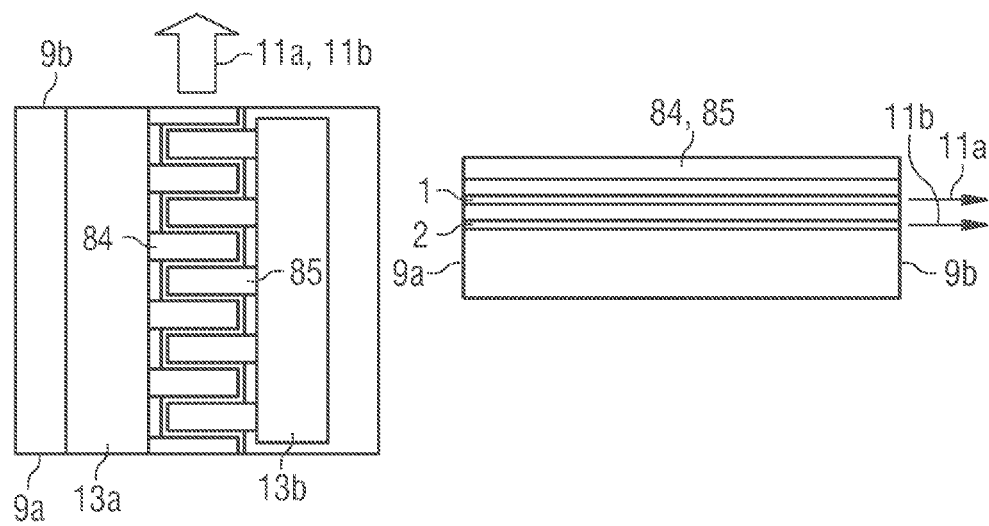
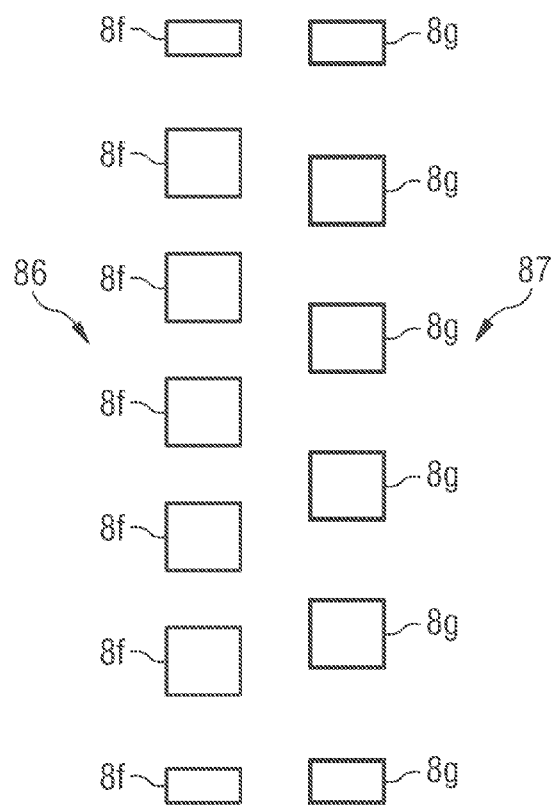
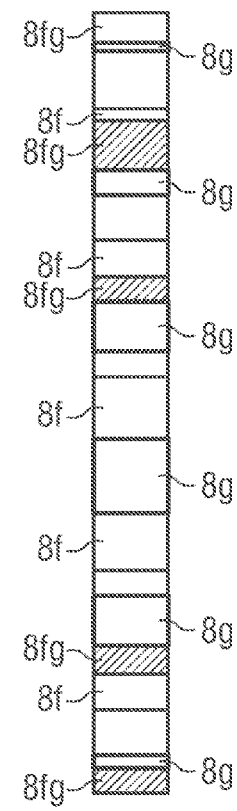

EDGE-EMITTING SEMICONDUCTOR LASER

This patent application is a national phase filing under section 371 of PCT/EP2012/060910, filed Jun. 8, 2012, which claims the priority of German patent application 10 2011 103 952.3, filed Jun. 10, 2011, each of which is incorporated herein by reference in its entirety.

TECHNICAL FIELD

The invention relates to an edge-emitting semiconductor laser.

BACKGROUND

The emission wavelength of semiconductor lasers is generally dependent on the temperature. This is based, in particular, on the temperature dependence of the electronic band gap of the semiconductor materials used. In order to reduce the generally undesirable temperature dependence of the emission wavelength, a temperature stabilization by means of passive or actively cooled heat sinks is carried out, for example, in conventional semiconductor lasers.

Alternatively or additionally, structures having a spatially varying refractive index are used, for example, in DFB or DBR lasers. The temperature dependence of the wavelength can be reduced by such structures, but an increased production outlay is generally required.

SUMMARY OF THE INVENTION

Embodiments of the invention specify an edge-emitting semiconductor laser, which is distinguished by a reduced and/or deliberately settable temperature dependence of the emission wavelength and can be produced with a comparatively low production outlay.

In accordance with one configuration, the edge-emitting semiconductor laser comprises a first waveguide layer, into which an active layer that generates laser radiation is embedded, and a second waveguide layer, into which no active layer is embedded. In other words, the edge-emitting semiconductor laser contains an active waveguide formed by the first waveguide layer with the embedded active layer, and a passive waveguide formed by the second waveguide layer.

In accordance with one configuration, the first waveguide layer is arranged between a first cladding layer and a second cladding layer, and the second waveguide layer is arranged between the second cladding layer and a third cladding layer. The first waveguide layer and the second waveguide layer are therefore arranged one above the other in a vertical direction and spaced apart from one another by the second cladding layer.

The laser radiation generated in the active layer advantageously forms a standing wave in a laser resonator formed by side facets of the semiconductor laser. The standing wave has, at periodic intervals in a beam direction of the semiconductor laser, in each case intensity maxima in the first waveguide layer and corresponding intensity minima in the second waveguide layer and intensity minima in the first waveguide layer and corresponding intensity maxima in the second waveguide layer.

In the semiconductor laser there are therefore periodically arranged regions in which the laser radiation propagating along the waveguide layers has a high intensity in the first waveguide layer and a lower intensity in the second waveguide layer, and regions which are arranged therebetween and in which the laser radiation has a high intensity in the second waveguide layer and a low intensity in the first waveguide layer. This is based on the fact that the laser radiation propagating in the adjacent waveguide layers can couple over partly or even completely from one waveguide to the other waveguide. The first waveguide layer and the second waveguide layer are therefore optically coupled to one another. Simulation calculations show that the waveguide structure comprising the first waveguide layer and the second waveguide layer enables the propagation of two laser modes for which the waveguide structure has two slightly different effective refractive indices, such that the two laser modes propagate with different velocities. The superimposition of the electromagnetic fields of the two modes capable of propagation leads to a periodic intensity profile in the beam direction in which the intensity alternately has maxima in one waveguide layer and corresponding minima in the other waveguide layer.

For the period length $\Gamma$ of the standing wave it holds true that $\Gamma=\lambda/(n_1-n_2)$, where $\lambda$ is the wavelength of the laser radiation and $n_1$ and $n_2$ are the effective refractive indices of the two superimposed laser modes. The period length $\Gamma$ of the standing wave is generally significantly greater than the wavelength of the laser radiation $\lambda$. By way of example, a period length $\Gamma=32$ μm results for the wavelength $\lambda=950$ nm and the effective refractive indices $n_1=3.4120$ and $n_2=3.3824$.

In accordance with one configuration, an at least regionally periodic contact structure is arranged at a surface of the edge-emitting semiconductor laser. A period length of the contact structure is equal to a period length of the standing wave. The periodic contact structure has, in particular, a periodic sequence of contact areas and openings situated therebetween. If a current is impressed into the semiconductor layer sequence of the edge-emitting semiconductor laser by the periodic contact structure, the active layer is electrically pumped in the regions below the contact areas, such that an optical amplification is present in said regions. By contrast, those regions of the active layer which lie below the openings arranged between the contact areas are absorbent. The periodic contact structure therefore produces a periodic amplification and absorption profile in the active layer. Since the period length of the standing wave is dependent on the emission wavelength of the semiconductor laser, the period length of the standing wave, in the case of a predefined period length of the contact structure, corresponds to the period length of the contact structure only for a specific emission wavelength. It is only for this emission wavelength that a standing wave arises whose period length corresponds to the amplification profile produced by the contact structure, such that only this emission wavelength defined by the period length of the contact structure is amplified. What is achieved in this way, therefore, is that the semiconductor laser has an emission wavelength that is set by the period length of the contact structure.

In the case of the semiconductor laser described here, in comparison with conventional semiconductor lasers, there is a reduction in particular of the temperature dependence of the emission wavelength on account of a temperature-dependent change in the electronic band gap of the material of the active layer. This is based on the fact that the emission wavelength is dependent on the period length of the contact structure and is thus fixed by the predefined contact structure.

Since the effective refractive indices of the laser modes capable of propagation are temperature-dependent, the period of the standing wave is also temperature-dependent, which can result in a temperature dependence of the emission wavelength. Since the period of the standing wave is dependent on the difference between the effective refractive indices of the laser modes and materials having different thermo-optical coefficients can be used for the waveguide layers, it is possible to deliberately set the absolute value and the sign of the temperature dependence of the emission wavelength.

In one preferred configuration, the emission wavelength of the semiconductor laser is substantially temperature-independent. In particular, the emission wavelength λ of the semiconductor laser can have a temperature dependence Δλ/ΔT of less than ±0.05 nm/K.

A combination of the materials of the first waveguide layer and of the second waveguide layer which are suitable for this purpose can be determined in particular by simulation calculations. By way of example, a simulation calculation is carried out which involves calculating the period of the standing wave as a function of the emission wavelength for different material parameters of the first and/or second waveguide layer. By way of example, the first waveguide layer and/or the second waveguide layer can comprise $Al_xGa_{1-x}As$ wherein, for example, the aluminum content x of the second waveguide layer is varied in the simulation calculation. It has been found, for example, that by varying the aluminum content x of the second waveguide layer, it is possible to set a defined increase in the emission wavelength with temperature, a substantially temperature-independent emission wavelength or a defined decrease in the emission wavelength as the temperature increases.

In one configuration, the emission wavelength of the semiconductor laser decreases as the temperature increases. In an alternative configuration of the semiconductor laser, the emission wavelength increases as the temperature increases.

The periodic contact structure preferably has contact areas and openings arranged therebetween. The width of the contact areas and of the openings arranged therebetween in the beam direction of the semiconductor laser is preferably half a period length in each case. Therefore, within a period, half of the surface of the semiconductor laser is covered by the contact area and the other half is not covered by the contact area.

In one advantageous configuration, at least one side facet of the semiconductor laser adjoins an edge contact area, the width of which is half the magnitude of the width of the remaining contact areas of the periodic contact structure. The width of the edge contact area is therefore preferably one quarter of the wavelength of the standing wave.

In this configuration, the laser radiation has at the side facet an intensity maximum in the first waveguide layer, into which the active layer is embedded. The side facet is, for example, the radiation coupling-out area of the semiconductor laser. In this configuration, therefore, the emitted radiation at the side facet is emitted in the region of the first waveguide layer.

In a further configuration, at least one side facet of the semiconductor laser adjoins an edge opening, the width of which is half the magnitude of the width of the openings of the periodic contact structure. The width of the edge opening is therefore preferably one quarter of the wavelength of the standing wave. In this configuration, the laser radiation has at the side facet an intensity maximum in the second waveguide layer. The side facet is, for example, the radiation coupling-out area of the semiconductor laser. In this configuration, the laser radiation is coupled out from the semiconductor laser in the region of the second waveguide layer.

It is furthermore also possible for the contact structure to have at least one non-periodic region. In particular, the at least one non-periodic region can adjoin a side facet of the semiconductor laser. That side facet of the semiconductor laser which adjoins the non-periodic region is preferably situated opposite the radiation coupling-out area. In this case, that side facet of the semiconductor laser which is provided as the radiation coupling-out area preferably adjoins a periodic region of the contact structure, such that, as described above, the embodiment of the contact structure makes it possible to define whether the laser radiation is coupled out from the semiconductor laser at the side facet in the region of the first waveguide layer or the second waveguide layer.

In a further configuration, the contact structure has a first periodic region and a second periodic region, which are arranged in a manner offset with respect to one another in the beam direction, wherein the first periodic region and the second periodic region are electrically insulated from one another and contact can be made with them separately. The first periodic region and the second periodic region have the same period, for example. Preferably, the first periodic region and the second periodic region are arranged in such a way that the first periodic contact structure has contact areas which adjoin the side facets of the semiconductor laser and the width of which is half the magnitude of the width of the remaining periodically arranged contact areas. The second periodic contact structure preferably has openings which adjoin the side facets of the semiconductor laser and the width of which is half the magnitude of the width of the remaining openings. In this configuration of the semiconductor laser, the laser radiation is coupled out at the side facet in the region of the first waveguide layer if electrical contact is made only with the first periodic contact structure region. The laser radiation is coupled out at the side facet in the region of the second waveguide layer if only the second periodic contact structure region is electrically connected. By optionally making contact with the first or the second periodic contact structure region, it is therefore possible to define the location of the side facet at which the laser radiation is coupled out from the semiconductor laser.

In a further advantageous configuration, the contact structure has a plurality of periodic partial regions having different periods for generating a plurality of different emission wavelengths.

The plurality of periodic partial regions are spaced apart from one another, for example, in a direction running perpendicular to the beam direction. In this case, the semiconductor laser is in particular a laser bar having a plurality of mutually offset emission regions, wherein contact is made with each of the emission regions by a periodic contact structure which can have different periods.

Alternatively, it is also possible for the plurality of periodic partial regions to adjoin one another in a direction running perpendicular to the beam direction. In this case, the emitted beam profiles of the plurality of emission regions overlap one another, such that a laser beam is emitted with a spectral bandwidth that is greater than in the case of an individual periodic contact structure.

In a further advantageous configuration, the plurality of periodic partial regions at least partly overlap in the beam direction. In this configuration, the contact structure has, for example, regions assigned to the first periodic contact structure, and further regions assigned to the second periodic contact structure. Furthermore, there are regions assigned simultaneously to both periodic contact structures.

BRIEF DESCRIPTION OF THE DRAWINGS

The invention is explained in greater detail below on the basis of exemplary embodiments in association with FIGS. 1 to 13.

FIG. 1 shows a schematic illustration of a cross section through an edge-emitting semiconductor laser in accordance with one exemplary embodiment;

FIG. 2 shows a schematic illustration of the intensity distribution of the standing wave in one exemplary embodiment of the edge-emitting semiconductor laser;

FIGS. 7 to 13 each show schematically illustrated plan views of the contact structure in various exemplary embodiments of the semiconductor laser.

Figure 3:
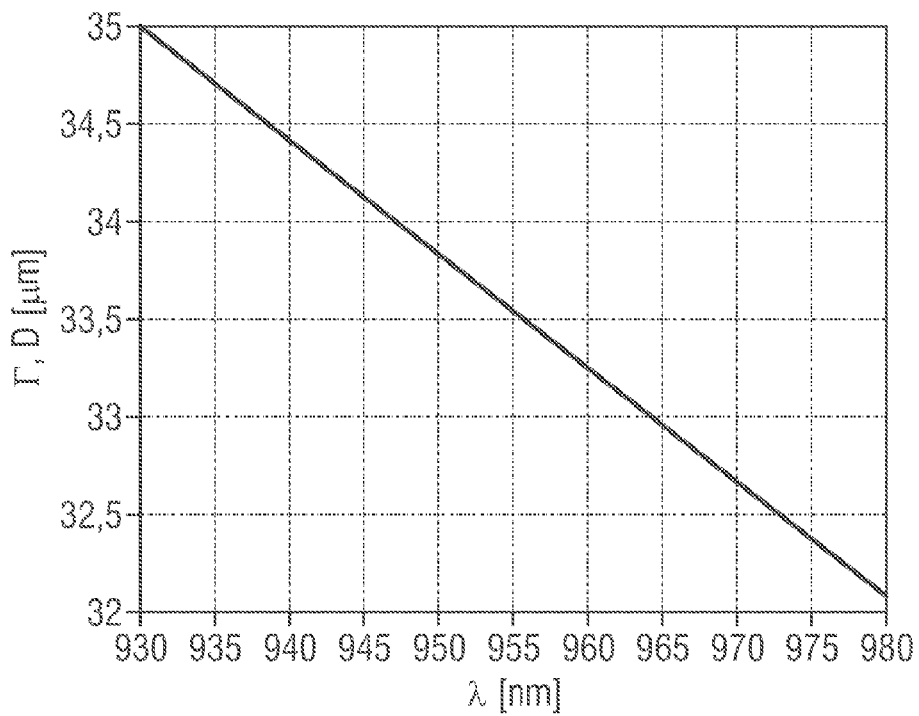
FIG. 3 shows a graphical illustration of the period of the standing wave as a function of the emission wavelength in one exemplary embodiment of the semiconductor laser.

Identical or identically acting component parts are provided with the same reference signs in each case in the figures. The illustrated component parts and the size relationships of the component parts among one another should not be regarded as true to scale.

DETAILED DESCRIPTION OF ILLUSTRATIVE EMBODIMENTS

The exemplary embodiment of an edge-emitting semiconductor laser as illustrated in FIG. 1 has a first waveguide layer 1 and a second waveguide layer 2. An active layer 3 is embedded into the first waveguide layer 1. The first waveguide layer has a first sublayer 1a and a second sublayer 1b, between which the active layer 3 is arranged. No active layer is embedded into the second waveguide layer 2. Consequently, the first waveguide layer 1 is an active waveguide layer and the second waveguide layer 2 is a passive waveguide layer.

The first waveguide layer 1 is arranged between a first cladding layer 4 and a second cladding layer 5. The second waveguide layer 2 is arranged between the second cladding layer 5 and a third cladding layer 6. The first waveguide layer 1 and the second waveguide layer 2 are therefore separated from one another by the second cladding layer 5.

The semiconductor layer sequence of the semiconductor laser can be grown onto a substrate 7, for example. For making electrical contact with the semiconductor laser, a periodic contact structure 8 is applied at a surface of the semiconductor laser. A current is impressed into the semiconductor layer sequence by the periodic contact structure 8, the current flowing to a rear-side contact 10 arranged, for example, at the rear side of the substrate 7. The periodic contact structure 8 is formed by contact areas 8a and openings 8b arranged therebetween. The contact areas 8a and the openings 8b are arranged periodically with a period length D. The width of the contact areas 8a and of the openings 8b in the beam direction 11 of the semiconductor laser is preferably half of the period length D in each case.

The side facets 9a, 9b of the semiconductor laser are adjoined by edge contact areas 8c, the width of which in the beam direction 11 is preferably one quarter of the period length D. The edge contact areas 8c are therefore preferably half as wide as the remaining contact areas 8a. What is achieved in this way is that the laser radiation reflected at one of the side facets 9a, 9b has the same phase as the incident laser radiation.

The first waveguide layer 1 and the second waveguide layer 2 together form a double waveguide structure. Two different laser modes can propagate simultaneously in the double waveguide structure. On account of the different spatial intensity distribution, different effective refractive indices arise for these laser modes. Therefore, the two laser modes propagate with slightly different velocities in the waveguide layers 1, 2. The superimposed electromagnetic fields of the laser modes form a standing wave in the laser resonator formed by the side facets 9a, 9b. As a result of constructive and destructive interference, the intensity maximum alternates spatially to and fro between the first waveguide layer and the second waveguide layer.

The spatial intensity distribution of the standing wave 12 in the laser resonator is illustrated schematically in FIG. 2. The standing wave 12 has, at periodic intervals, intensity maxima in the first waveguide layer 1. Where the standing wave has an intensity maximum in the first waveguide layer 1, it has a corresponding intensity minimum in the second waveguide layer 2. The first waveguide layer 1 has intensity minima at positions that are offset from the intensity maxima by half a period length, wherein corresponding intensity maxima are present at these locations in the second waveguide layer 2. For the period length $\Gamma$ of the standing wave it holds true that $\Gamma=\lambda/(n_1-n_2)$, where $\lambda$ is the wavelength of the laser radiation, and $n_1$ and $n_2$ are the effective refractive indices of the laser modes capable of propagation in the waveguide layers 1, 2.

The effective refractive indices $n_1$ and $n_2$ are determined by the materials of the waveguide layers 1, 2 and of the surrounding cladding layers 4, 5, 6. In the semiconductor laser, the period D of the periodic contact structure is adapted to the period $\Gamma$ of the standing wave. By means of the contact areas 8a of the periodic contact structure, a current is impressed into periodically arranged regions of the active layer and an optical amplification is therefore produced at these locations. In the regions of the openings 8b arranged between the contact areas 8a, the material of the active layer is not electrically pumped and has an absorbent effect there. The periodic contact structure 8 therefore produces a periodic amplification and absorption profile having the period length D. The periodic amplification and absorption profile has the effect of supporting precisely the mode profile whose resulting standing wave has the same period length $\Gamma$ as the period length D of the periodic contact structure. Since the period length $\Gamma$ of the standing wave is dependent on the wavelength $\lambda$ of the laser radiation, the wavelength $\lambda$ of the laser radiation can be set by the period length D of the periodic contact structure.

The dependence of the period length $\Gamma$ of the standing wave on the laser wavelength $\lambda$ is illustrated in FIG. 3. For a predefined period $\Gamma$ of the standing wave which is equal to the period length D of the periodic contact structure, a fixed emission wavelength $\lambda$ of the semiconductor laser results. The emission wavelength $\lambda$ of the semiconductor laser is therefore set by the period D of the periodic contact structure. In particular, what is advantageously achieved in this way is that a temperature-dictated change in the electronic band gap of the semiconductor material does not directly lead to a change in the emission wavelength $\lambda$.

Figure 4:
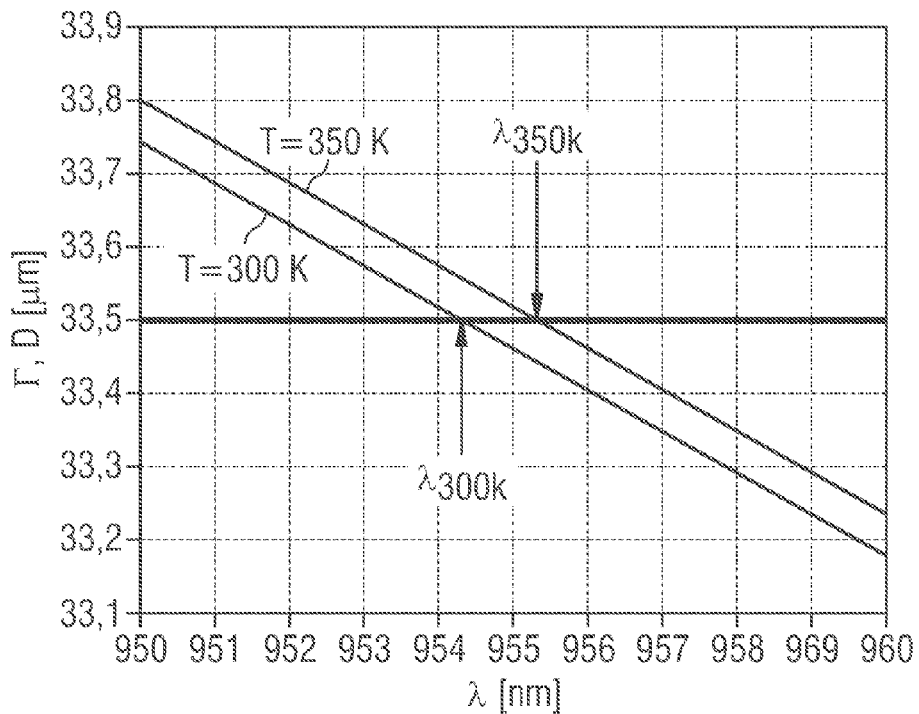
FIG. 4 shows a graphical illustration of the period of the standing wave as a function of the emission wavelength for two different operating temperatures in a further exemplary embodiment of the semiconductor laser.

However, the emission wavelength $\lambda$ of the semiconductor laser is generally not completely temperature-independent, since the effective refractive indices of the laser modes and thus the period length $\Gamma$ of the standing wave in the laser resonator are dependent on the temperature. FIG. 4 illustrates the dependence of the period length $\Gamma$ of the standing wave on the emission wavelength $\lambda$ at temperatures of T=300 K and T=350 K.

The simulation is based on a layer system constructed as in FIG. 1 and comprising the following layers: a first cladding layer 4 composed of $Al_{0.23}Ga_{0.77}As$, a first waveguide layer 1 having a 45 nm thick first sublayer 1a composed of $Al_{0.06}Ga_{0.94}As$, a 10 nm thick GaAs quantum well as active layer and a 45 nm thick sublayer 1b composed of $Al_{0.06}Ga_{0.94}As$, a 500 nm thick second cladding layer 5 composed of $Al_{0.23}Ga_{0.77}As$, a 90 nm thick second waveguide layer 2 composed of $Al_{0.1}Ga_{0.9}As$ and a third cladding layer 6 composed of $Al_{0.23}Ga_{0.77}As$. The simulation shows that for a predefined period length D that is equal to the period length Γ of the standing wave, a greater emission wavelength λ results at the temperature T=350 K than at the temperature T=300 K. By way of example, an emission wavelength $λ_{300K}$=954.2 nm results at T=300 K for a period length D=33.5 μm. The emission wavelength increases with increasing temperature by approximately 0.02 nm/K, such that the emission wavelength $λ_{350K}$ at T=350 K is approximately 1 nm greater than at T=300 K.

Figure 5:
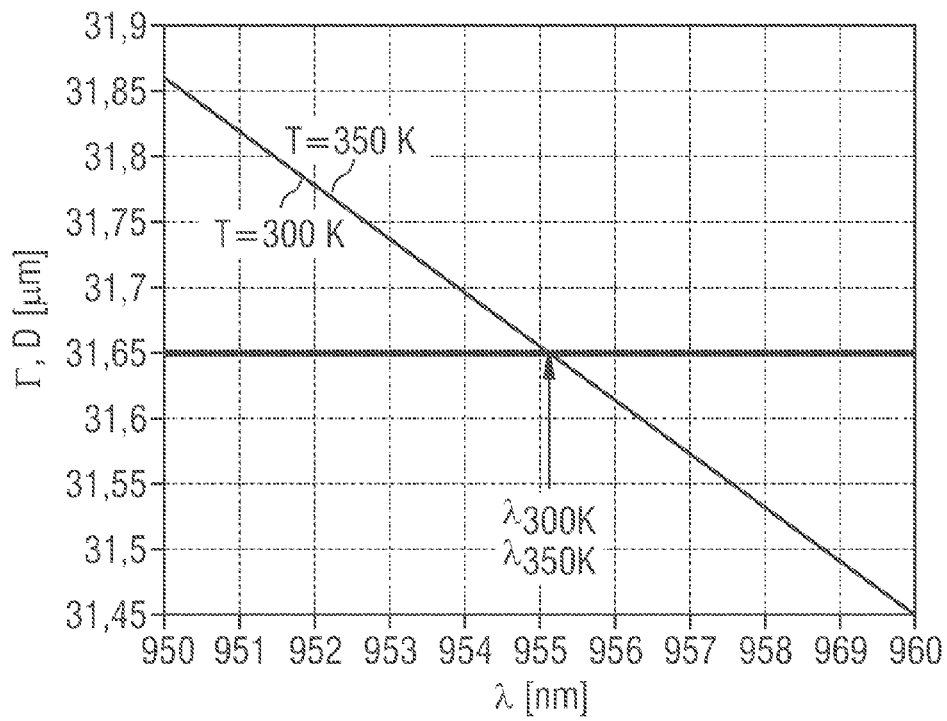
FIG. 5 shows a graphical illustration of the period of the standing wave as a function of the emission wavelength for two different operating temperatures in a further exemplary embodiment of the semiconductor laser.

The temperature dependence of the emission wavelength can advantageously be deliberately influenced by a change of the layer thicknesses and/or refractive indices of the waveguide layers 1, 2 and/or of the cladding layers 4, 5, 6. FIG. 5 shows the simulation of the period length D as a function of the wavelength λ wherein, in contrast to the exemplary embodiment illustrated in FIG. 4, the second waveguide layer 2 comprises $Al_{0.14}Ga_{0.84}As$. The second waveguide layer 2 therefore has a greater proportion of aluminum than the second waveguide layer 2 composed of $Al_{0.10}Ga_{0.90}As$ in the exemplary embodiment illustrated in FIG. 4. In the case of the simulation illustrated in FIG. 5, the curves for T=300 K and T=350 K lie directly on top of one another, such that the emission wavelength λ is substantially temperature-independent. By way of example, for a predefined period length D=31.65 μm the same emission wavelength results at the temperature T=300 K as at T=350 K. A particularly thermally stable laser can advantageously be realized in this way. In particular, $|Δλ/ΔT|<0.05$ nm/K can hold true.

Figure 6:
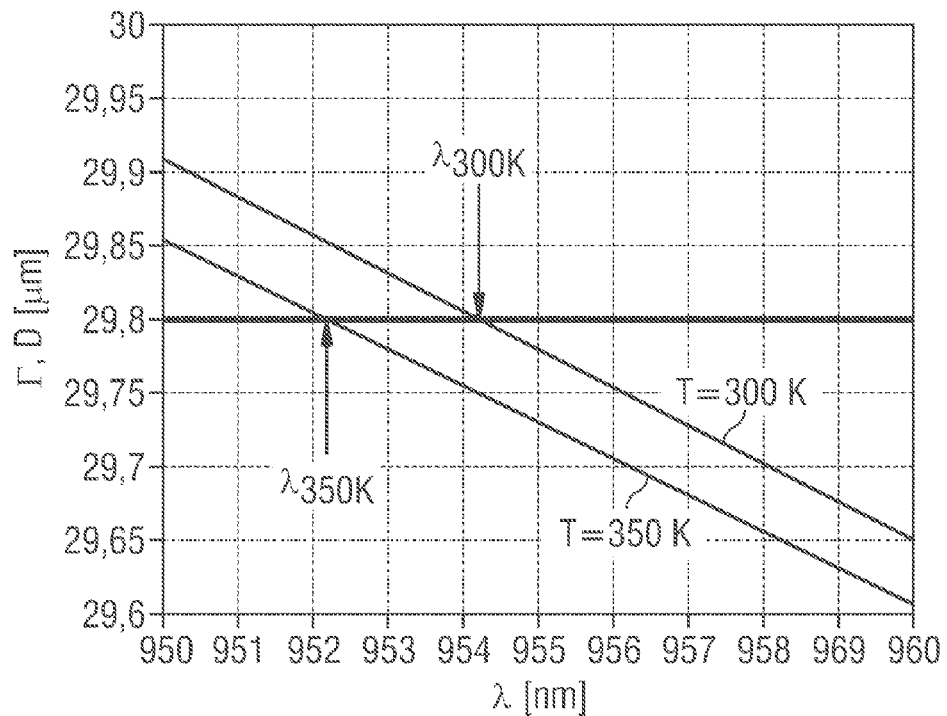
FIG. 6 shows a graphical illustration of the period of the standing wave as a function of the emission wavelength for two different operating temperatures in a further exemplary embodiment of the semiconductor laser.

FIG. 6 illustrates the period length D as a function of the wavelength λ for a further exemplary embodiment, in which the proportion of aluminum in the second waveguide layer 2 was increased even further. In this exemplary embodiment, the second waveguide layer 2 comprises $Al_{0.18}Ga_{0.82}As$. In this case, the emission wavelength λ for a predefined period length D decreases as the temperature increases. The change in the emission wavelength λ with temperature is approximately −0.04 nm/K. In the semiconductor laser described here, therefore, it is even possible to obtain a negative temperature drift of the emission wavelength λ.

The configuration of the contact structure at the surface of the semiconductor laser affords diverse possibilities for influencing the spatial and/or spectral emission characteristic of the semiconductor laser, as explained on the basis of the following further exemplary embodiments.

Figure 7A:
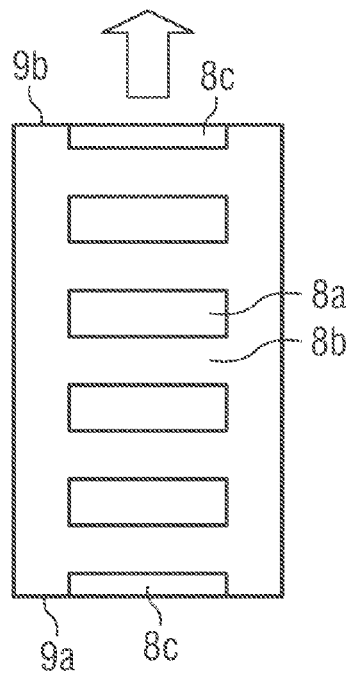

The contact structure illustrated in a plan view in FIG. 7A has a multiplicity of periodically arranged contact areas 8a with openings 8b arranged therebetween, wherein the side facets 9a, 9b of the semiconductor laser are in each case adjoined by edge contact areas 8c, the width of which is only half the magnitude of the width of the remaining contact areas 8a. In this configuration of the semiconductor laser, the standing wave has at the side facets 9a, 9b in each case an intensity maximum in the first waveguide layer. The laser radiation is therefore coupled out from the semiconductor laser at a side facet 9b serving as radiation coupling-out area in the region of the first waveguide layer.

Figure 7B:
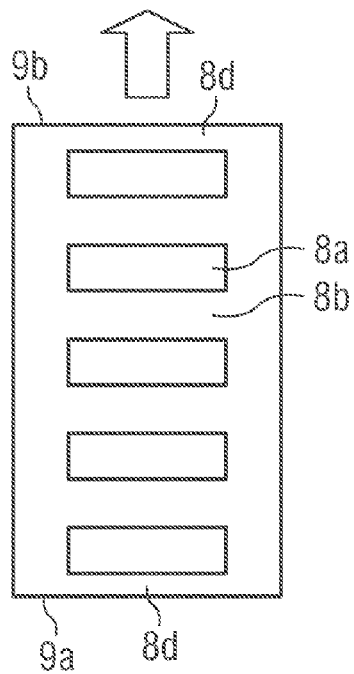

In the exemplary embodiment illustrated in FIG. 7B, the side facets 9a, 9b of the semiconductor laser are adjoined in each case by an edge opening 8d that is half as wide as the remaining openings 8b of the periodic contact structure. In this configuration of the semiconductor laser, the standing wave has at the side facets 9a, 9b in each case an intensity minimum in the first waveguide layer and an intensity maximum in the second waveguide layer. The laser radiation is therefore coupled out from the semiconductor laser at a laser facet 9b provided as radiation coupling-out area in the region of the second waveguide layer.

During the production of the side facets 9a, 9b of the semiconductor laser, it may possibly be difficult to comply exactly with the desired width of the edge contact area 8c or of the edge opening 8d.

Figure 8A:
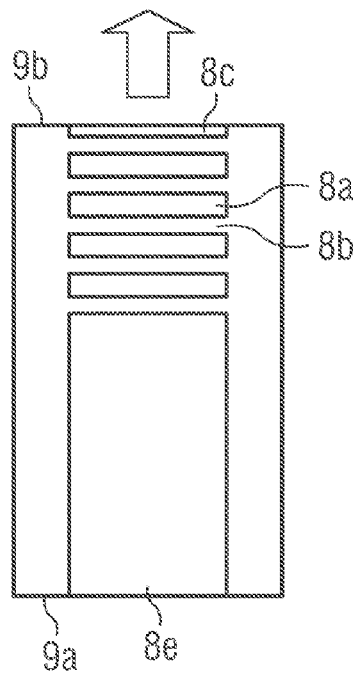

In order to reduce the production outlay, it may therefore be advantageous to embody the contact structure only partly periodically. FIG. 8A illustrates a plan view of an exemplary embodiment of a contact structure which has periodically arranged contact areas 8a only in a partial region. In addition, the contact structure has a non-periodic region 8e. The periodic region is adjacent to a side facet 9b of the semiconductor laser that is provided as radiation coupling-out area. The radiation coupling-out area 9b is adjoined by an edge contact area 8c, the width of which is preferably one quarter of the period of the standing wave. In this case, therefore, the radiation is coupled out from the semiconductor laser from the first waveguide layer. The non-periodic region 8e of the contact structure adjoins the side facet 9a of the semiconductor laser situated opposite the radiation coupling-out area.

Figure 8B:
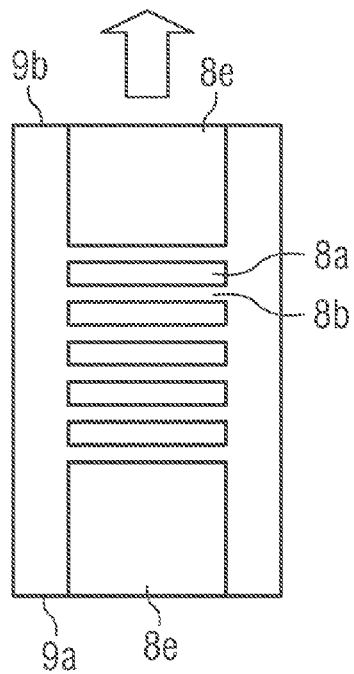

FIG. 8B illustrates a further exemplary embodiment of a contact structure in a plan view, in which the contact structure is formed periodically only in a central region. In this exemplary embodiment, both side facets 9a, 9b of the semiconductor laser are adjoined by a respective non-periodic region 8e of the contact structure.

Figure 9:
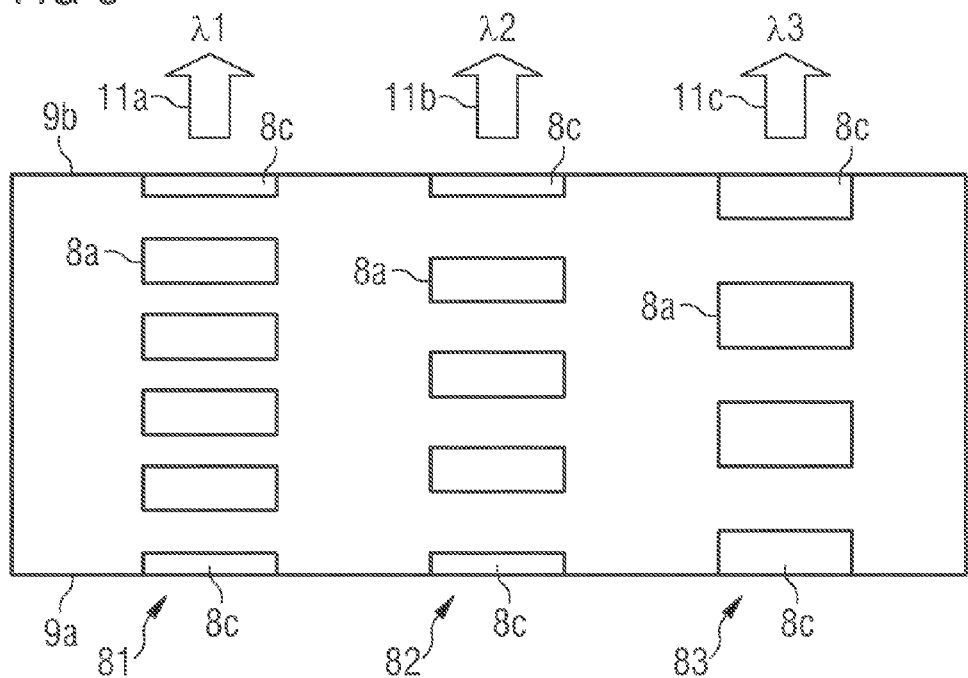

By virtue of the fact that the emission wavelength in the semiconductor laser is defined in particular by the period length of the contact structure, it is possible to realize a semiconductor laser having a plurality of emission wavelengths by arranging a plurality of contact structures having different period lengths alongside one another. By way of example, FIG. 9 illustrates an exemplary embodiment of a semiconductor laser which is a laser bar having three different emission wavelengths. The laser bar has three contact structure regions 81, 82, 83 running parallel to one another and having different period lengths, which are arranged in a manner offset with respect to one another in a direction running perpendicular to the beam directions. On account of the different period lengths of the contact structure regions 81, 82, 83, the laser bar emits a plurality of laser beams 11a, 11b, 11c having mutually different wavelengths λ1, λ2 and λ3.

Figure 10:
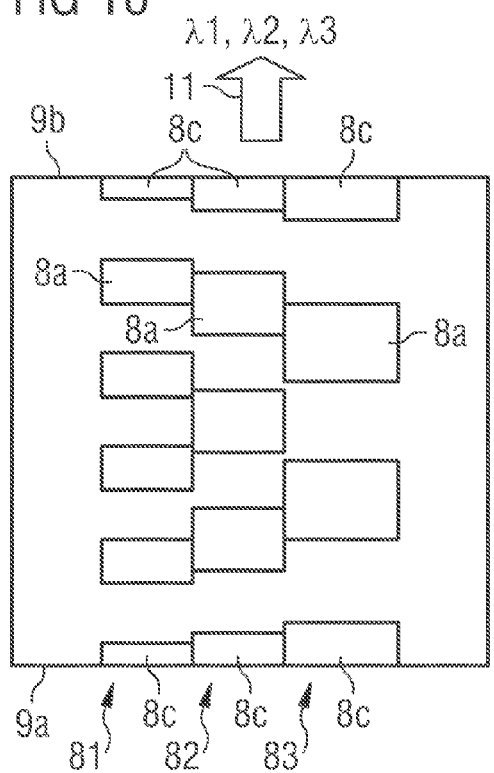

FIG. 10 illustrates a further exemplary embodiment of a contact structure having a plurality of periodic regions running parallel to one another. In contrast to the exemplary embodiment illustrated in FIG. 9, however, the three contact structure regions 81, 82, 83 are not spaced apart from one another, but rather adjoin one another in a direction running perpendicular to the beam direction 11. This has the consequence that the beam profiles generated by the plurality of contact structure regions overlap one another, such that a single laser beam 11 is emitted with an enlarged spectral bandwidth.

FIG. 11 illustrates a further exemplary embodiment of a contact structure in a plan view and in a side view, in which the contact structure has a first periodic region 84 and a second periodic region 85, which are arranged in a manner offset with respect to one another in the beam direction, wherein the first periodic region 84 and the second periodic region 85 are electrically insulated from one another and contact can be made with them separately. The first periodic contact structure 84 and the second periodic contact structure region 85 each have the same period length and are arranged in a manner offset with respect to one another by half a period length in the beam direction. The first periodic contact structure 84 has edge contact areas 8c adjoining the side facets 9a, 9b of the semiconductor laser, while the second periodic contact structure region 85 has edge openings 8d adjoining the side facets 9a, 9b.

Contact can be made with the first periodic region 84 via a connection area 13a, and contact can be made with the second periodic region 85 via a connection area 13b. The connection areas 13a, 13b are insulated from the surface of the semiconductor laser, for example, by means of an electrically insulating layer, such that the current flow into the semiconductor laser takes place only through the contact structure regions 84, 85. When contact is made with the first contact structure region 84, a laser beam 11a is coupled out at the side facet 9b of the semiconductor laser in the region of the first waveguide layer 1. By contrast, when contact is made with the second contact structure region 85, a laser beam 11b is coupled out in the region of the second waveguide layer 2 at the side facet 9b of the semiconductor laser. By optionally making contact with the connection area 13a or the connection area 13b, it is therefore possible to set the position of the emitted laser beam 11a, 11b in a vertical direction. If contact is made with the two contact structure regions 84, 85 simultaneously via the connection areas 13a, 13b, the semiconductor laser overall has no periodic contact structure and functions as a conventional broad-stripe laser.

It is furthermore also possible to realize a contact structure which has a plurality of periodic partial regions having different periods for generating a plurality of different emission wavelengths, wherein the partial regions at least partly overlap in the beam direction. FIG. 12A illustrates a contact structure having two periodic contact structure regions 86, 87 arranged alongside one another. The contact structure region 86 is formed by contact areas 8f having a first period length. The contact structure region 87 is formed by contact areas 8g having a second period length, which differs from the first period length.

FIG. 12B illustrates how the contact structure regions 86, 87 can be arranged in the beam direction such that they overlap in the beam direction, wherein optionally the first or the second contact structure region can be electrically connected. The contact structure illustrated in FIG. 12B has contact areas 8f that are connected for the purpose of making contact with the first contact structure region. Furthermore, the contact structure has partial regions 8g that are connected for the purpose of making contact with the second contact structure. In addition, the contact structure has contact areas 8fg that are in each case connected both for making contact with the semiconductor laser with the first contact structure region and for making contact with the semiconductor laser with the second contact structure region. In order to operate the semiconductor laser with a wavelength defined by the periodic structure 86 in FIG. 12A, the contact areas 8f and 8g are therefore connected in the case of the semiconductor laser illustrated in FIG. 12B. In order to realize a semiconductor laser having a contact structure corresponding to the periodic contact structure 87 in FIG. 12A, the contact areas 8g and 8fg are electrically connected.

Figure 13:
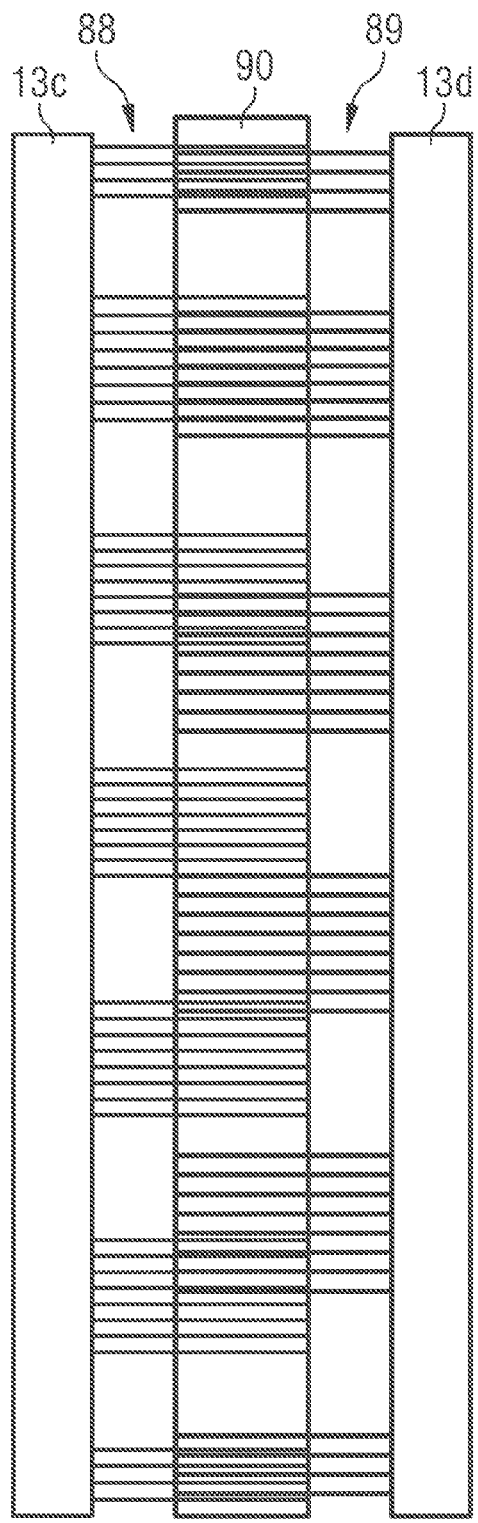

FIG. 13 illustrates a further example of how it is possible to realize a contact structure which has two contact structure regions 88, 89 overlapping in the beam direction and having different period lengths, wherein contact can be made with the two contact structure regions 88, 89 separately. The contact areas for the first partial region having the first period and the second partial region having the second period are formed in each case by grating structures, wherein the periods of the gratings are significantly smaller than the periods of the contact structure regions 88, 89. The two grating structures intermesh in an overlap region 90 and contact can be made with them separately. The first grating-type contact structure region 88 has a connection area 13c and the second grating-type contact structure region 89 has a second connection area 13d.

The contact structure regions 88, 89 are electrically conductively connected to the surface of the semiconductor laser preferably only in the overlap region 90. The parts of the contact structure regions 88, 89 that are arranged outside the overlap region 90 and the connection areas 13c, 13d are insulated from the surface of the semiconductor laser, for example, by means of an electrically insulating layer, such that the current flow into the semiconductor laser takes place only in the overlap region 90.

When electrical contact is made with the connection area 13c, the semiconductor laser is operated with the grating-type contact structure region 88 having the first period length. When electrical contact is made with the second connection area 13d, the semiconductor laser is operated with the second grating-type contact structure region 89 having the second period length. The semiconductor laser can therefore advantageously be operated with two different wavelengths which can be selected by the selection of one of the connection contacts 13c, 13d.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An edge-emitting semiconductor laser comprising:
    a first waveguide layer, into which an active layer that generates laser radiation is embedded, and
    a second waveguide layer, into which no active layer is embedded;
    wherein the first waveguide layer is arranged between a first cladding layer and a second cladding layer and the second waveguide layer is arranged between the second cladding layer and a third cladding layer;
    wherein the laser radiation generated in the active layer forms a standing wave in a laser resonator formed by side facets of the semiconductor laser, the standing wave having, at periodic intervals in a beam direction of the semiconductor laser, in each case intensity maxima in the first waveguide layer and corresponding intensity minima in the second waveguide layer and intensity minima in the first waveguide layer and corresponding intensity maxima in the second waveguide layer;
    wherein an at least regionally periodic contact structure is arranged at a surface of the edge-emitting semiconductor laser;
    wherein a period length of the contact structure is equal to a period length of the standing wave, such that the semiconductor laser has an emission wavelength $\lambda$ that is set by the period length of the contact structure; and wherein the contact structure has a plurality of periodic partial regions having different periods for generating a plurality of different emission wavelengths.

2. The edge-emitting semiconductor laser according to claim 1, wherein the emission wavelength λ of the semiconductor laser has a temperature dependence Δλ/ΔT where, |Δλ/ΔT|<0.05 nm/K.

3. The edge-emitting semiconductor laser according to claim 1, wherein the emission wavelength λ of the semiconductor laser decreases as the temperature increases.

4. The edge-emitting semiconductor laser according to claim 1, wherein the emission wavelength λ of the semiconductor laser increases as the temperature increases.

5. The edge-emitting semiconductor laser according to claim 1, wherein the periodic contact structure has contact areas and openings arranged therebetween.

6. The edge-emitting semiconductor laser according to claim 5, wherein a width of each contact area and of each opening arranged therebetween in the beam direction of the semiconductor laser is half a period length.

7. The edge-emitting semiconductor laser according to claim 5, wherein at least one side facet of the semiconductor laser adjoins an edge contact area, a width of the edge contact area being half the magnitude of a width of the contact areas of the periodic contact structure.

8. The edge-emitting semiconductor laser according to claim 5, wherein at least one side facet of the semiconductor laser adjoins an edge opening, a width of the edge opening being half the magnitude of a width of the openings of the periodic contact structure.

9. The edge-emitting semiconductor laser according to claim 1, wherein the contact structure has at least one non-periodic region.

10. The edge-emitting semiconductor laser according to claim 9, wherein the at least one non-periodic region adjoins a side facet of the semiconductor laser that is situated opposite a side facet serving as radiation coupling-out area.

11. The edge-emitting semiconductor laser according to claim 1, wherein the contact structure has a first periodic region and a second periodic region, which are arranged in a manner offset with respect to one another in the beam direction, wherein the first periodic region and the second periodic region are electrically insulated from one another and contact can be made with them separately.

12. The edge-emitting semiconductor laser according to claim 1, wherein the partial regions are spaced apart from one another in a direction running perpendicular to the beam direction.

13. The edge-emitting semiconductor laser according to claim 1, wherein the partial regions adjoin one another in a direction running perpendicular to the beam direction.

14. The edge-emitting semiconductor laser according to claim 1, wherein the partial regions at least partly overlap in the beam direction.

* * * * *